(12) United States Patent
Ono et al.

(10) Patent No.: US 11,139,208 B2
(45) Date of Patent: Oct. 5, 2021

(54) SEMICONDUCTOR DEVICE AND METHOD OF MANUFACTURING SEMICONDUCTOR DEVICE

(71) Applicant: Toshiba Memory Corporation, Tokyo (JP)

(72) Inventors: Takanobu Ono, Kuwana Mie (JP); Tsutomu Fujita, Yokkaichi Mie (JP); Ippei Kume, Yokkaichi Mie (JP); Akira Tomono, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/559,552

(22) Filed: Sep. 3, 2019

(65) Prior Publication Data

US 2020/0294856 A1 Sep. 17, 2020

(30) Foreign Application Priority Data

Mar. 14, 2019 (JP) .............................. JP2019-047449

(51) Int. Cl.
*H01L 21/78* (2006.01)
*H01L 23/31* (2006.01)
(Continued)

(52) U.S. Cl.
CPC ............ *H01L 21/78* (2013.01); *H01L 21/268* (2013.01); *H01L 21/304* (2013.01); *H01L 21/56* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 7,737,001 | B2 | 6/2010 | Abe et al. |
| 8,735,771 | B2 | 5/2014 | Kuno et al. |

(Continued)

FOREIGN PATENT DOCUMENTS

| | | |
|---|---|---|
| CN | 104968621 A | 10/2015 |
| JP | 2012-004278 A | 1/2012 |

(Continued)

OTHER PUBLICATIONS

K. Shimamura, et al. "Molecular-Dynamics Study of Void-Formation inside Silicon Wafers in Stealth Dicing", Journal of Physics: Conference Series 402 (2012) 012044, IOP Pubishing Ltd, pp. 1-9.

*Primary Examiner* — Samuel Park
(74) *Attorney, Agent, or Firm* — Kim & Stewart LLP

(57) ABSTRACT

A semiconductor device includes a semiconductor wafer chip, a semiconductor device layer, and a reflectance reducing layer. The semiconductor wafer chip includes a device region and a peripheral region around the device region. The peripheral region includes a plurality of voids aligned along a side surface of the semiconductor wafer chip at a predetermined depth from a first surface of the semiconductor wafer chip. The semiconductor device element layer is on the first surface in the device region. The reflectance reducing layer is on the first surface of the semiconductor wafer chip in the peripheral region, that reduces a reflection of laser light incident from a second surface of the semiconductor wafer chip.

15 Claims, 14 Drawing Sheets

(51) Int. Cl.
  *H01L 21/56*    (2006.01)
  *H01L 21/268*   (2006.01)
  *H01L 21/304*   (2006.01)

(52) U.S. Cl.
  CPC ...... *H01L 23/3171* (2013.01); *H01L 23/3192* (2013.01)

(56) References Cited

U.S. PATENT DOCUMENTS

| | | |
|---|---|---|
| 8,828,306 B2 | 9/2014 | Uchiyama |
| 2002/0067897 A1* | 6/2002 | Van Arendonk ..... G02B 6/4212 385/89 |
| 2006/0022195 A1* | 2/2006 | Wang ..................... H01L 22/32 257/48 |
| 2007/0111480 A1 | 5/2007 | Maruyama et al. |
| 2008/0286938 A1* | 11/2008 | Pu ........................... H01L 21/78 438/458 |
| 2012/0119386 A1* | 5/2012 | Ito ........................ H01L 23/585 257/777 |
| 2014/0110859 A1* | 4/2014 | Rafferty ............ H01L 23/49822 257/774 |
| 2015/0321942 A1 | 11/2015 | Masuda et al. |

FOREIGN PATENT DOCUMENTS

| | | |
|---|---|---|
| JP | 2016-082023 A | 5/2016 |
| TW | 200639012 A | 11/2006 |
| TW | 200703496 A | 1/2007 |
| TW | 200719431 A | 5/2007 |

\* cited by examiner

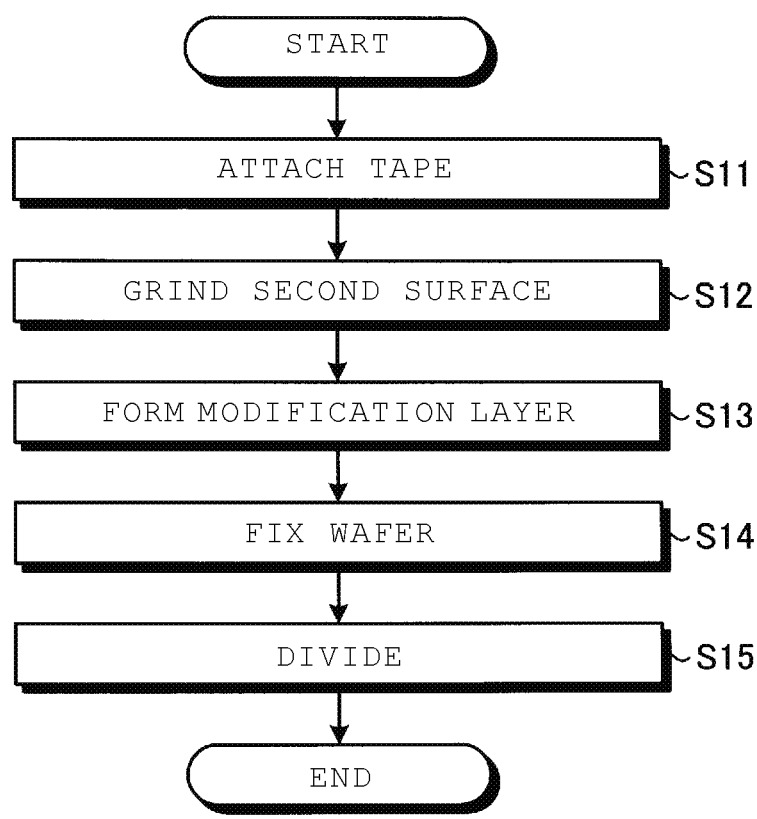

FIG. 2A
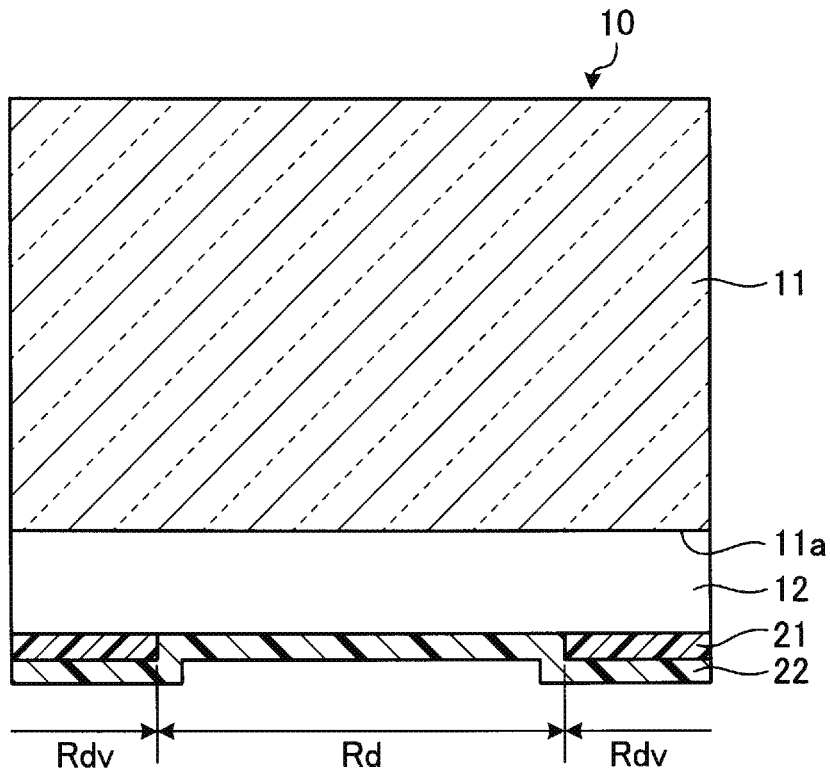
FIG. 2B
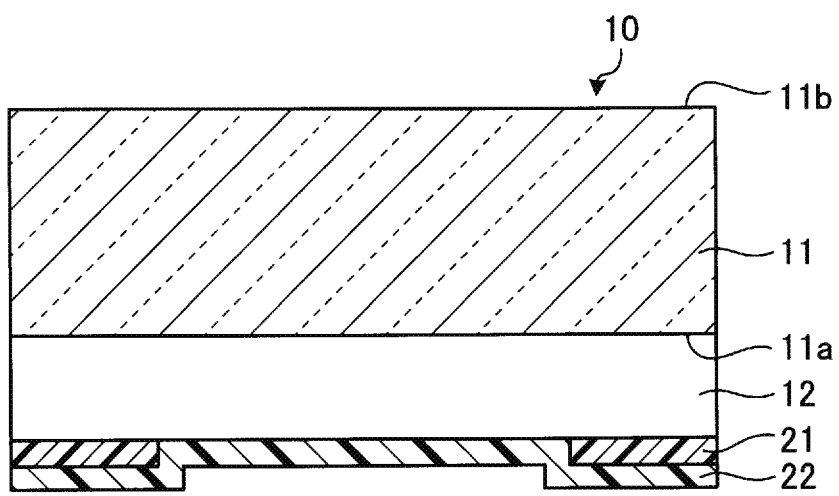
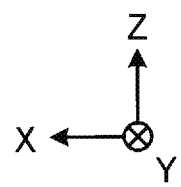

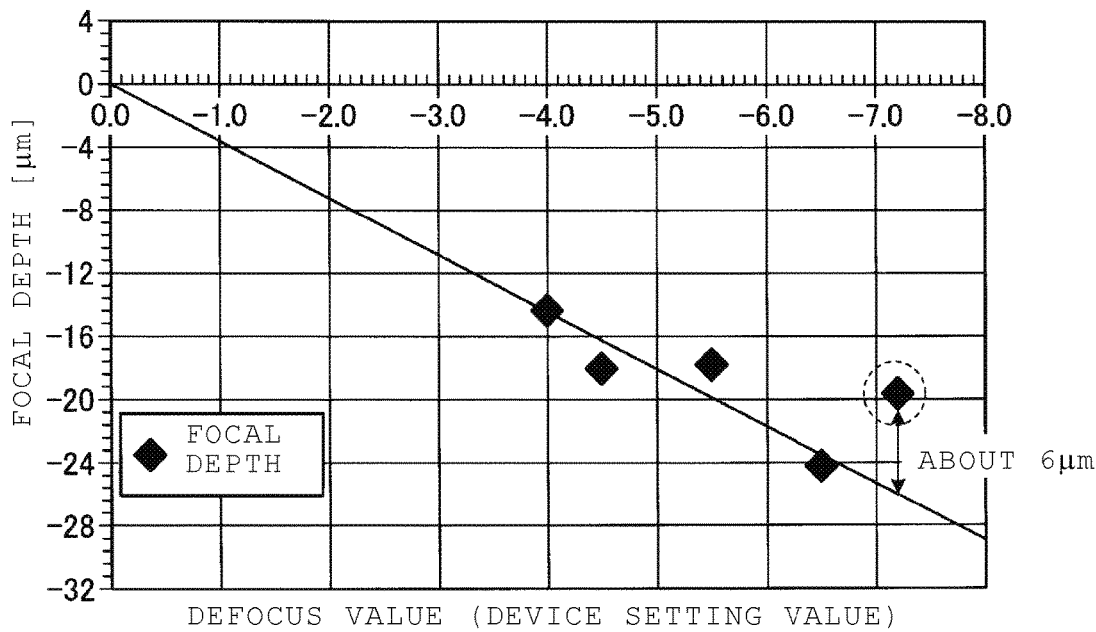

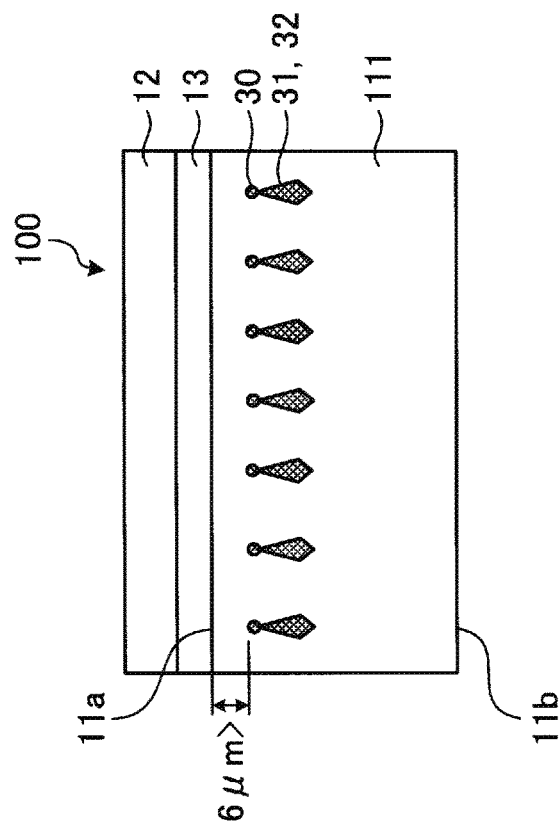
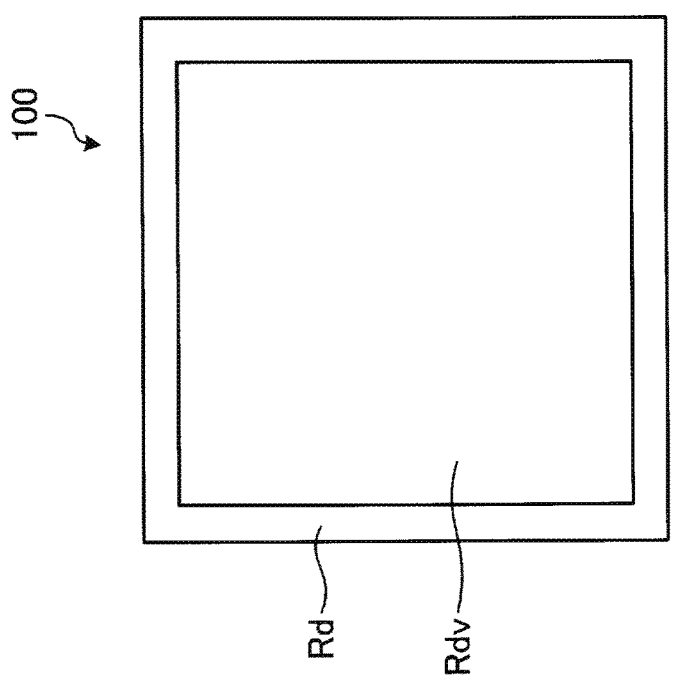

| POLISHING METHOD | ROUGHNESS (RmaxD [μm]) | BACK SURFACE REFLECTANCE [%] |
|---|---|---|
| #320 | 2.495 | 3.44 |
| #4800 | 0.114 | 34.96 |
| #8000 | 0.054 | 35.31 |
| GDP | 0.038 | 35.63 |

SEMICONDUCTOR DEVICE AND METHOD OF MANUFACTURING SEMICONDUCTOR DEVICE

CROSS-REFERENCE TO RELATED APPLICATION(S)

This application is based upon and claims the benefit of priority from Japanese Patent Application No. 2019-047449, filed Mar. 14, 2019, the entire contents of which are incorporated herein by reference.

FIELD

Embodiments described herein relate generally to a semiconductor device and a method of manufacturing the semiconductor device.

BACKGROUND

In a stealth dicing technique, a laser beam is focused within a semiconductor substrate along a dicing line, which causes a portion of the semiconductor substrate at the point of focus to be modified. The modified portion, referred to as a modification layer, is cleavable such that the semiconductor substrate can be diced into a plurality of chips.

However, when the thickness of the semiconductor substrate becomes thinner, it is more difficult to dice the semiconductor substrate using a stealth dicing technique.

DESCRIPTION OF THE DRAWINGS

FIG. 1 is a flowchart showing an example of a procedure of a method of manufacturing a semiconductor device using stealth dicing.

FIGS. 2A to 2D are cross-sectional views of a semiconductor device to schematically show an example of the procedure of the method of manufacturing the semiconductor device using stealth dicing.

FIG. 3 is a graph showing an example of a relationship between a setting value of a focal position and an actual focal depth in a stealth dicing device.

FIG. 4 is a table showing an example of a quality of a modification layer according to a structure of a wafer.

FIGS. 7A and 7B schematically show an example of the configuration of the semiconductor device according to the first embodiment.

DETAILED DESCRIPTION

Embodiments provide a semiconductor device and a method of manufacturing the semiconductor device by which a semiconductor substrate can be diced using a stealth dicing technique even when the thickness of the semiconductor substrate is thin.

In general, according to an embodiment, a semiconductor device includes a semiconductor wafer chip, a semiconductor device layer, and a reflectance reducing layer. The semiconductor wafer chip includes a device region and a peripheral region around the device region. The semiconductor wafer chip in the peripheral region includes a plurality of voids aligned along a side surface of the semiconductor wafer chip at a predetermined depth from a first surface of the semiconductor wafer chip. The semiconductor device layer is on the first surface of the semiconductor wafer chip in the device region. The reflectance reducing layer is on the first surface of the semiconductor wafer chip in the peripheral region and reduces a reflection of laser light incident from a second surface of the semiconductor wafer chip.

A semiconductor device and a method of manufacturing the semiconductor device according to an embodiment will be described below with reference to the accompanying drawings. The present disclosure is not limited by these embodiments. The cross-sectional views of the semiconductor device used in the following embodiments are schematic, and relationships between depicted thicknesses and widths of layers, ratios between different dimensions, and the like may be different from those in an actual implementation.

First Embodiment

Figure 2C:
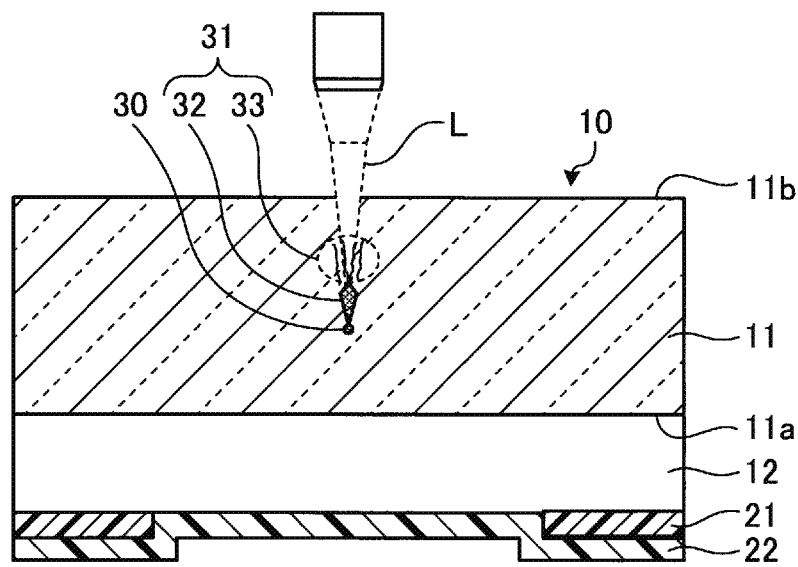
Figure 2D:
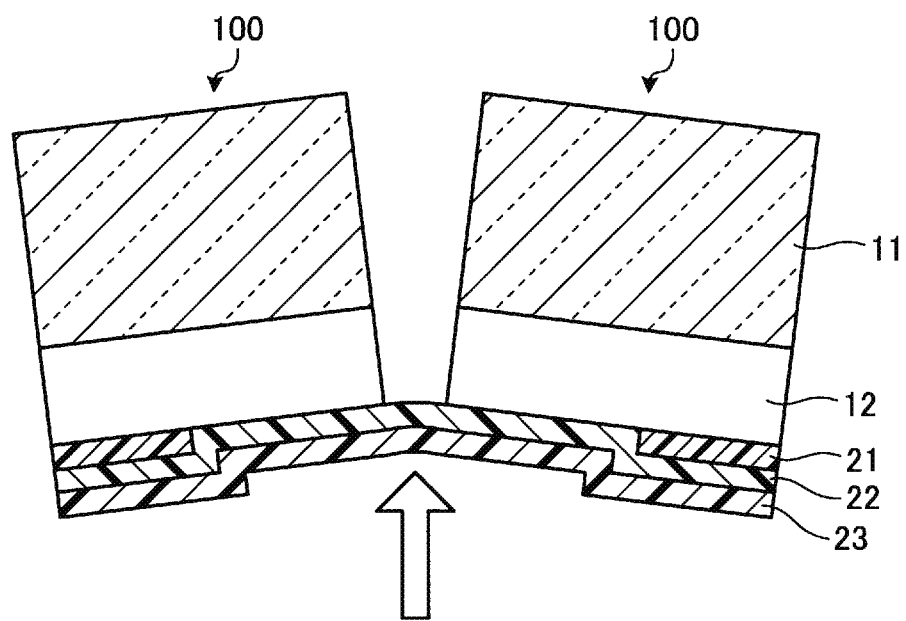

First, stealth dicing will be described. FIG. 1 is a flowchart showing an example of a procedure of a method of manufacturing a semiconductor device using stealth dicing. FIGS. 2A to 2D are cross-sectional views of the semiconductor device to show an example of the procedure of the method of manufacturing the semiconductor device using stealth dicing. In FIGS. 2A and 2B, the thickness direction of the device wafer 11 is a Z direction, the direction perpendicular to the Z direction, and the scanning direction of the laser beam during stealth dicing is a Y direction, and the direction perpendicular to the Z direction and the Y direction is an X direction.

First, a semiconductor device 10 is prepared. The semiconductor device 10 includes a device layer 12 provided on a first surface 11a side of a device wafer 11, which is a semiconductor substrate. The device wafer 11 is, for example, a silicon wafer. The device layer 12 includes an element such as a field effect transistor, and a wiring layer connecting the elements. For example, the device layer 12 may be a layer including memory cells constituting a NAND flash memory. A passivation film 21 is provided on the device layer 12. The passivation film 21 is formed to cover, for example, a device disposition region Rdv, which is a first region. In the present example, the passivation film 21 is not provided in a dicing region Rd, which is a second region, disposed around the device disposition region Rdv. For example, in the case of having a (001) main surface substrate of a silicon wafer, the dicing region Rd is provided along a <110> direction.

A tape 22 is attached on the passivation film 21 and the device layer 12 of the semiconductor device 10 with an adhesive (step S11, FIG. 2A). Here, the tape 22 is, for example, a surface protecting tape. The tape 22 contains, for example, a base material and an adhesive.

Then, grinding is performed, for example, with a grinding stone from the second surface 11b opposite to the first surface 11a of the device wafer 11 so that the device wafer 11 has a predetermined thickness (step S12, FIG. 2B). Thereafter, the laser beam L is emitted from the second surface 11b side of the device wafer 11, and the laser beam L is condensed in the device wafer 11 to form a modification layer 31 (step S13, FIG. 2C). The laser beam L is, for example, a transmission laser in the infrared region. The laser beam L is scanned, for example, along the Y direction.

When the device wafer 11 is irradiated with the laser beam L, silicon is vaporized instantaneously at a condensing point 30 where the laser beam L is condensed, and a void 32 is formed. A crack 33 is formed in the device wafer 11 by the tensile stress at the time of vaporization and the compressive stress at the time of formation of the void 32 when the device wafer 11 is cooled. The modification layer 31 includes the void 32 and the crack 33.

After forming the modification layer 31 along the dicing region Rd, the device wafer 11 is fixed by attaching a tape 23 with an adhesive (step S14). Here, the adhesive is, for example, die attach film (DAF). The tape 23 contains, for example, a base material and an adhesive. Then, the whole tape 23 is pulled toward the outer periphery (step S15, FIG. 2D). Thereby, the cracks 33 formed along with the individual voids 32 extend from the device wafer 11 to the surface of the device layer 12 and are diced into chips 100. In the present example, the tape 23 is attached after the modification layer 31 is formed, although it may be attached before the modification layer 31 is formed. Thus, a semiconductor device is manufactured.

When the thickness of the device wafer 11 is thinner than, for example, 30 μm, it is difficult to separate the device wafer 11 by such a method. FIG. 3 is a graph showing an example of a relationship between a setting value of a focal position and an actual focal depth in a stealth dicing device. In FIG. 3, the horizontal axis indicates a defocus value set in the stealth dicing device. Specifically, the defocus value is a setting value to set to which depth the laser beam L incident surface (the second surface 11b) of the device wafer 11 subjected to stealth dicing is to be focused. The closer to the right side, the closer to the first surface 11a. The vertical axis indicates the focal depth when stealth dicing is performed by the stealth dicing device. A portion closest to the first surface 11a side of the void 32 of the modification layer 31 is a condensing point 30, and this position is an actual focal depth.

As shown in FIG. 3, in a case where the defocus value is in the range of −4.0 to −6.5 μm, that is, when the vicinity of the center of the thickness of the wafer 11 is in focus, the actual focal depth varies linearly with the setting value, which is the defocus value. That is, the condensing point 30 is formed at the set position. However, if the defocus value is smaller than −6.5 μm, that is, when the region closer to the device layer 12 side of the device wafer 11 is in focus, the actual focal depth moves to the first surface 11a by about 6 μm more than the defocus value. That is, the condensing point 30 is not formed at the set position. As a result, it is difficult to perform proper dicing without meandering or the like of the cleavage plane which is a cutting plane of the device wafer 11.

FIG. 4 depicts a table showing an example of a quality of a modification layer according to a structure of a wafer. Here, stealth dicing is performed on two types of wafers, the device wafer 11 and a mirror-polished wafer 41 having semiconductor elements formed on a surface. The device wafer 11 and the mirror-polished wafer 41 are silicon wafers, and the thicknesses thereof are assumed to be the same.

In the device wafer 11, the device layer 12 including a metal film such as tungsten is disposed on the first surface 11a side, and an oxide film 16 manufactured in the manufacturing process of the semiconductor device is disposed on the second surface 11b which is an incident surface of the laser beam L. The mirror-polished wafer 41 is a wafer in which no film other than the natural oxide film is disposed on the first surface 41a and the second surface 41b.

When stealth dicing is performed on each wafer, the thickness of the modification layer 31 is slightly thicker for the device wafer 11 than for the mirror-polished wafer 41. In the device wafer 11, the crack 33 of the modification layer 31 has a complicated shape. As a result, it is difficult to perform proper dicing without meandering of the cleavage plane of the device wafer 11 or the like. On the other hand, in the mirror-polished wafer 41, the crack 33 of the modification layer 31 has a clean shape elongated in the thickness direction of the mirror-polished wafer 41.

Referring to the schematic view of the modification layer 31 in FIG. 4, the modification layer of the mirror-polished wafer 41 includes a clean crack elongated in the thickness direction compared to the modification layer of the device wafer 11, and the mirror-polished wafer 41 is cleaved by dicing to have a clean cleavage plane. Here, the cleavage plane may be along a predetermined crystal orientation, although it may not necessarily be along the crystal orientation.

Thus, the state on the first surface 11a side of the device wafer 11 may be the reason of the difference between the device wafer 11 and the mirror-polished wafer 41. That is, in the device wafer 11, the metal film is disposed on the first surface 11a side, whereas in the mirror-polished wafer 41, there is no metal film on the first surface 41a side, and a natural oxide film is disposed. The reflectance when light of 1,342 nm is incident from the second surface 41b side of the mirror-polished wafer 41 in which the silicon oxide film is disposed on the first surface 41a is calculated to be 17% by simulation. The reflectance when light of 1,342 nm is incident from the second surface 11b side of the device wafer 11 in which a metal film such as tungsten is disposed on the first surface 11a is considered to be larger than that in the case where a silicon oxide film is disposed.

Figure 5:
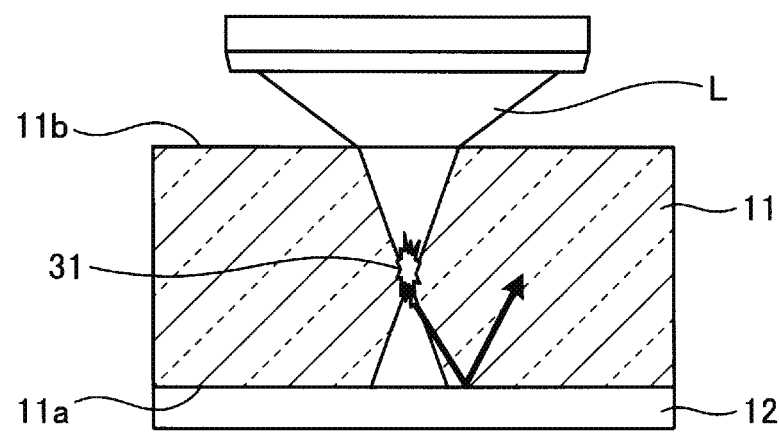
FIG. 5 is a schematic diagram to explain an influence on the stealth dicing by the presence of a metal film.

From the above, it is considered that the presence of a film that raises the reflectance of a metal film or the like disposed on the first surface 11a may affect stealth dicing. FIG. 5 is a diagram for illustrating an influence on the stealth dicing by the presence of a metal film. As shown in FIG. 5, in the thin device wafer 11 in which the device layer 12 is disposed on the first surface 11a, the laser beam L used in stealth dicing is reflected by the metal film disposed on the first surface 11a side in the device layer 12. Considering the result of FIG. 3, even when attempting to focus on the position of a desired depth from the second surface 11b, the reflection of the laser beam L by the metal film inhibits the modification reaction for forming the modification layer 31 and prevents focusing on the desired position. Alternatively, considering the result of FIG. 4, even if the modification layer could be formed at the desired position, the reflection of the laser beam L by the metal film makes it difficult to form a clean crack elongated in the thickness direction as in the mirror-polished wafer 41. For these reasons, as the device wafer 11 becomes thinner, cleavage by stealth dicing is considered to be difficult.

Therefore, in the first embodiment, as compared to directly disposing the metal film on the first surface 11a of the device wafer 11, a reflectance reducing layer in which the reflectance to the laser beam L is reduced is provided on the dicing region Rd of the first surface 11a of the wafer 11.

Figure 6:
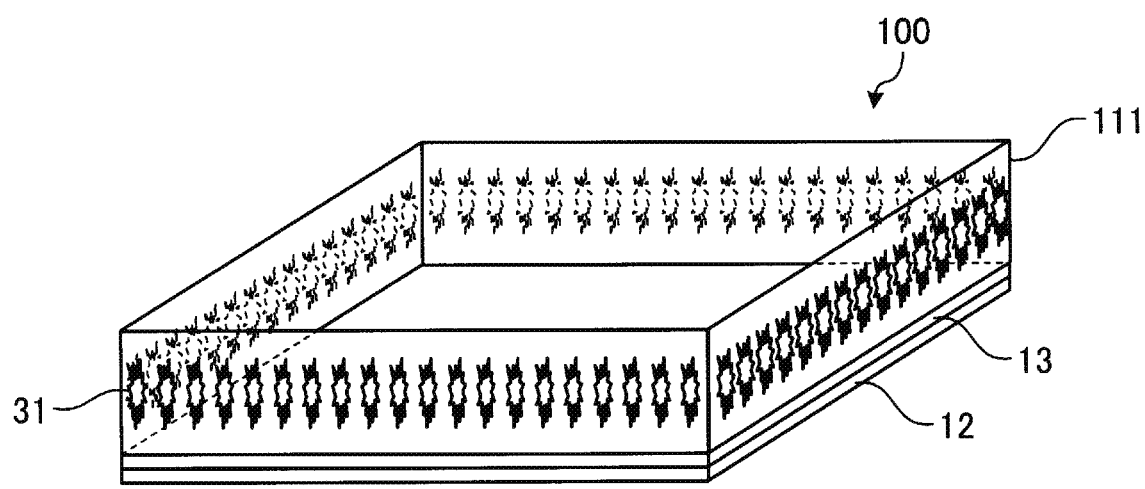
FIG. 6 is a perspective view of the semiconductor device according to a first embodiment.

FIG. 6 is a perspective view of an example of a configuration of the semiconductor device according to a first embodiment. FIGS. 7A and 7B schematically show an example of the configuration of the semiconductor device according to the first embodiment, FIG. 7A is a top view seen from the first surface side, and FIG. 7B is a side view of FIG. 7A.

The semiconductor device shown in FIG. 6 and FIGS. 7A and 7B is the chip 100 diced from the device wafer 11 by stealth dicing. The chip 100 includes a rectangular semiconductor substrate 111 which is a part of the device wafer 11. The semiconductor substrate 111 includes a rectangular device disposition region Rdv in which the device layer 12 is disposed, and a dicing region Rd provided along the outer periphery of the device disposition region Rdv. The dicing region Rd has a rectangular ring shape. The extending direction of each side of the semiconductor substrate 111 corresponds to the crystal orientation which is easily cleaved.

In the device disposition region Rdv, the device layer 12 including the metal film is disposed on the first surface 11a of the semiconductor substrate 111.

In the dicing region Rd, the reflectance reducing layer is provided between the first surface 11a of the semiconductor substrate 111 and the metal film forming the device layer 12. The reflectance reducing layer 13 has reflectance equal to or less than the reflectance when the laser beam L is emitted from the second surface 11b side of the silicon wafer in which the silicon oxide film is disposed on the first surface 11a. The reflectance reducing layer 13 may be formed of a film of TaSi, WSi, SiN, SiO2, SiC, a-Si, or poly-Si. In the dicing region Rd, a metal film provided in the device placement region Rdv is disposed on the reflectance reducing layer 13. The reflectance reducing layer 13 may be provided in both the dicing area Rd and also in the device disposition region Rdv.

Thus, the reflection of the laser beam L incident from the second surface 11b on the first surface 11a side of the device wafer 11 during stealth dicing is reduced by providing the reflectance reducing layer 13 in the dicing region Rd. As a result, it is possible to focus on the position in the device wafer 11 corresponding to the defocus value set by the stealth dicing device. It is possible to form the modification layer 31 including the clean crack 33 extending in the thickness direction of the device wafer 11. The modification layer 31 forms a cleavage plane having a predetermined orientation. The cleavage plane may be provided along the crystal orientation of the device wafer 11 which is easily cleaved. For example, the cleavage plane is (111) surface and may be an inclined plane.

Stealth dicing has no kerf compared to mechanical dicing. Therefore, as described above, a part of the dicing region Rd remains in the chip 100. The side surface of the semiconductor substrate 111 includes the dicing region Rd and also includes the modification layer 31. A portion of the modification layer 31 located closest to the first surface 11a of the void 32, that is, the condensing point 30 may be accommodated in the range of 6 μm from the first surface 11a. In stealth dicing, the modification layer 31 is formed using a pulse laser. The distance between the modification layers 31 changes according to the oscillation interval of the pulse laser and the relative scanning speed between the pulse laser and the semiconductor device 10.

In the first embodiment, the reflectance reducing layer 13 is provided between the device wafer 11 and the metal film in the dicing region Rd of the first surface 11a of the device wafer 11. Thereby, when stealth dicing the device wafer 11, the reflection of the laser beam L at the interface of the first surface 11a of the device wafer 11 is reduced, and the modification layer 31 can be formed at the desired position in the device wafer 11. As a result, even if the device wafer 11 is thinned to about 30 μm or less and the device layer 12 including the metal film is disposed on the first surface 11a, it is possible to satisfactorily dice the device wafer 11 without the meandering of the cleavage plane and the like by using stealth dicing. In particular, even if the device wafer is thin as 25 μm or less, it is possible to properly dice the device wafer.

The reflectance reducing layer 13 is provided between the first surface 11a of the semiconductor substrate 111 of the dicing region Rd of the semiconductor device 10, which includes the device placement region Rdv and the dicing region Rd, and the same metal film as the metal film constituting the device layer 12. This makes it possible to correct the warp of the semiconductor device when the semiconductor device is warped by the stress due to the deposition of the film.

Second Embodiment

In a second embodiment, a semiconductor device including a reflectance reducing layer for scattering a laser beam will be described.

Figures 8, 9:
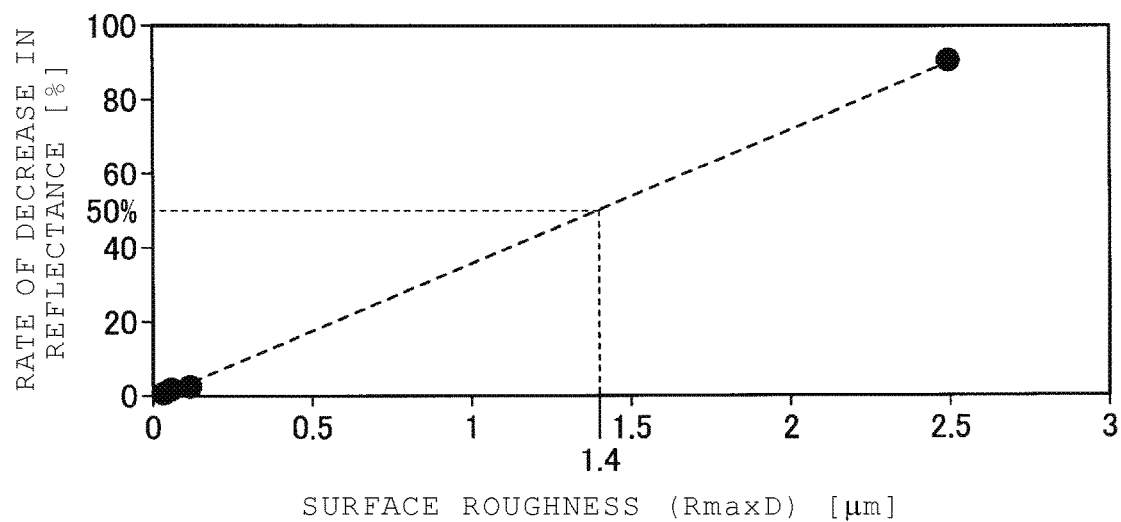
FIG. 8 is a table showing differences in back surface roughness and reflectance due to differences in back surface finish of the wafer.
FIG. 9 is a graph showing an example of a relationship between the surface roughness obtained from FIG. 8 and a rate of decrease in reflectance.

FIG. 8 is a table showing differences in back surface roughness and reflectance due to differences in back surface finish of the wafer. Here, as the back surface finish, the case of polishing using abrasive grains of mesh size #320, #4800, and #8000 and the case of polishing using a gettering dry polish (hereinafter, referred to as GDP) are mentioned as examples. A maximum height RmaxD is used as the back surface roughness. As shown in this drawing, as a polishing method becomes finer, the roughness also becomes smaller and the reflectance tends to become higher.

FIG. 9 is a graph showing an example of a relationship between the surface roughness obtained from FIG. 8 and a rate of decease in reflectance. In FIG. 9, the horizontal axis indicates the maximum height RmaxD, and the vertical axis indicates a rate of decrease in reflectance (%). The rate of decrease in reflectance is based on the back surface reflectance of GDP with the smallest roughness. As shown in this drawing, the rate of decrease in reflectance decreases linearly as the surface roughness of the device wafer 11 decreases. In this case, the back surface is a surface opposite to the incident surface of the laser beam, and is, for example, the first surface 11a.

In FIG. 4, the reflectance when the natural oxide film is disposed on the first surface 11a is 17%. If the reflectance of the device wafer 11 having a metal film can be reduced, it is possible to form the modification layer 31 at the desired position without inhibiting the modification reaction during stealth dicing. For example, when the device layer 12 of the device wafer 11 includes a metal film, the reflectance thereof is about 30 to 50% depending on the material of the metal film. Therefore, when the reflectance is halved, the reflectance is 15 to 25%, and it is considered that it is easy to form an excellent modification layer. Therefore, it is understood from FIG. 9 that, for example, in order to reduce the reflectance by 50%, the target of the maximum height may be 1.4 μm. When another type of film instead of a metal film is disposed on the first surface 11a, the target value of the maximum height is appropriately changed according to the reflectance and the like.

Figure 10:
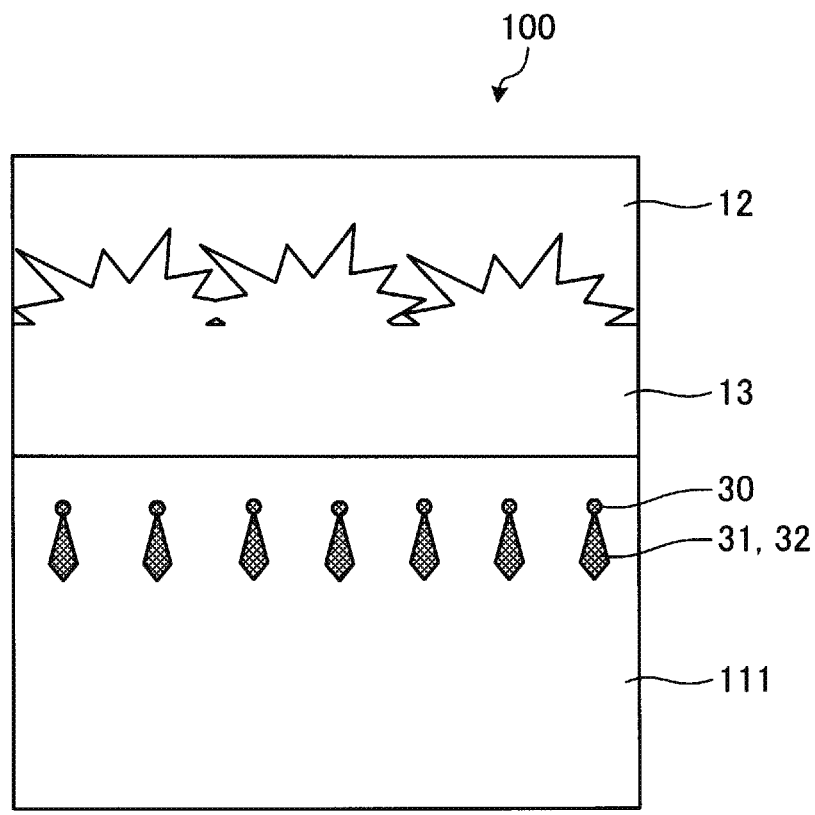
FIG. 10 is a side view of an example of a configuration of the semiconductor device according to a second embodiment.

FIG. 10 is a side view of an example of a configuration of the semiconductor device according to a second embodiment. FIG. 10 shows the dicing region Rd of the chip 100 which is a diced semiconductor device, similarly to FIG. 7B of the first embodiment. In the chip of the second embodiment, the reflectance reducing layer 13 has a maximum height RmaxD of 1.4 μm or more. The reflectance reducing layer 13 of the present embodiment may be formed of a single crystalline silicon or a material same as that of the reflectance reducing layer 13 according to the first embodiment. The device layer 12 including a metal film is disposed on the reflectance reducing layer 13.

Such a reflectance reducing layer 13 is formed on the device wafer 11, and further a resist is applied thereon. Thereafter, using a light exposure technique and a development technique, the device disposition region Rdv is covered, and a resist pattern capable of forming a maximum height of 1.4 μm or more is formed on the dicing region Rd. Then, processing is performed using the resist pattern as a mask by using an etching technique such as a reactive ion etching (RIE) method, whereby the reflectance reducing layer 13 having a maximum height more than or equal to 1.4 μm is formed.

In the second embodiment, the reflectance reducing layer 13 having a surface roughness RmaxD more than or equal to 1.4 μm is provided on the dicing region Rd of the device wafer 11. Thereby, similar to the first embodiment, during stealth dicing, reflection of the laser beam L at the interface between the device wafer 11 and the device layer 12 can be reduced, and the modification layer 31 can be formed to the desired depth in the device wafer 11 even with the thin device wafer 11. As a result, even the thin device wafer 11 can be diced into the chips 100 by stealth dicing.

Third Embodiment

In a third embodiment, a semiconductor device including a reflectance reducing layer for reducing the reflectance of a laser beam by thin film optics will be described.

In the third embodiment, the reflectance reducing layer 1 include a material that reduces the reflectance of the laser beam L incident not by scattering but by, for example, light interference. The reflectance reducing layer 13 includes a film made of a material which is optically calculated to have reflectance lower than a predetermined value. A multilayer film in which films having different dielectric constants are stacked may be used as the reflectance reducing layer 13. The reflectance reducing layer 13 may be, for example, a dielectric multilayer film in which a plurality of dielectric films having different dielectric constants is stacked. Instead of the dielectric multilayer film, a multilayer film in which an oxide film and a semiconductor film are stacked may be used.

Figure 11:
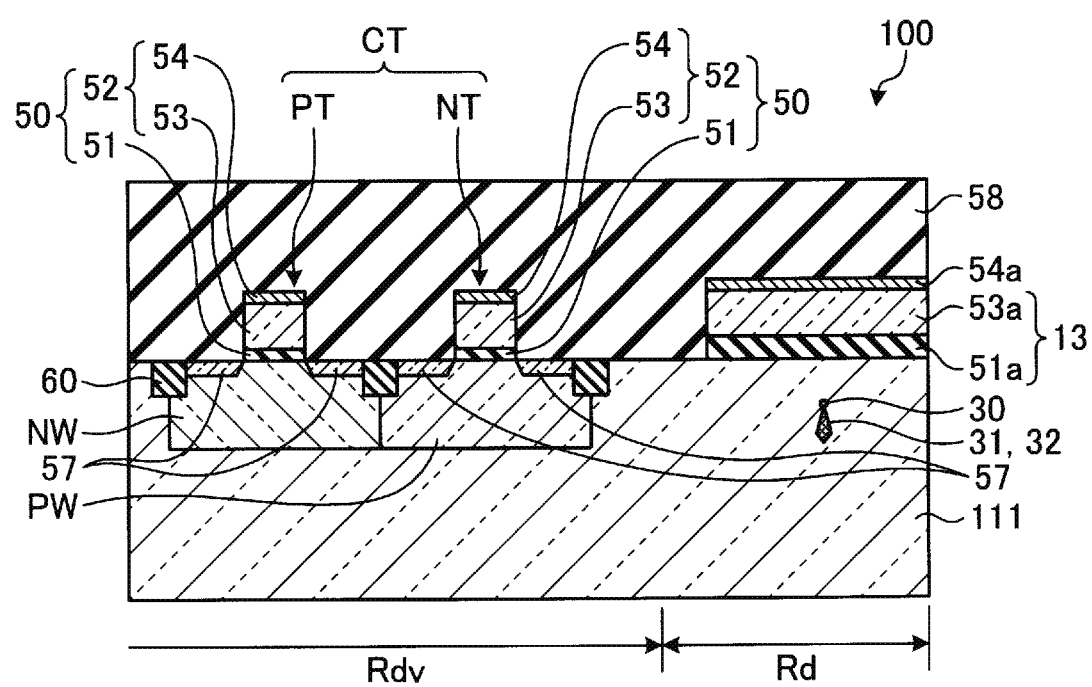
FIG. 11 is a cross-sectional view of an example of a configuration of a semiconductor device according to a third embodiment.

FIG. 11 is a cross-sectional view of an example of a semiconductor device according to a third embodiment. FIG. 11 shows the dicing region Rd of the chip 100, which is a diced semiconductor device, similarly to FIG. 7B of the first embodiment. In the device disposition region Rdv of the semiconductor substrate 111, an element including a complementary metal-oxide semiconductor (CMOS) transistor is disposed. A CMOS transistor CT includes a P-channel type transistor (hereinafter, referred to as a PMOS transistor) PT and an N-channel type transistor (hereinafter, referred to as an NMOS transistor) NT.

The PMOS transistor PT is disposed on an N-well NW provided on the semiconductor substrate 111, and the NMOS transistor NT is disposed on the P-well PW provided on the semiconductor substrate 111. The PMOS transistor PT has a gate structure 50 in which a gate insulating film 51 and a gate electrode 52 are stacked, and source/drain regions 57 provided in the upper layer portion of the N-well NW sandwiching the gate structure 50 therebetween, on the N-well NW. The source/drain region 57 includes a diffusion layer in which a P-type impurity is diffused.

The NMOS transistor NT has the gate structure 50 in which the gate insulating film 51 and the gate electrode 52 are stacked, and the source/drain regions 57 provided in the upper layer portion of the P-well PW sandwiching the gate structure 50 therebetween, on the P-well PW provided on the semiconductor substrate 111. The source/drain region 57 includes a diffusion layer in which an N-type impurity is diffused. The PMOS transistor PT and the NMOS transistor NT are separated by an element isolation insulating film 60. The gate insulating film 51 of the PMOS transistor PT and the NMOS transistor NT is made of, for example, a silicon oxide film, and the gate electrode 52 is made of a stacked film of a polysilicon film 53 and a metal film 54. An interlayer insulating film 58 is disposed on the device disposition region Rdv made of an element including the PMOS transistor PT and the NMOS transistor NT, and a contact connected to the source/drain region 57, a wiring layer connected to the contact, and the like are further disposed to form a device layer 20.

In the dicing region Rd, a film disposed in the device disposition region Rdv is disposed. That is, in this case, on the dicing region Rd, a silicon oxide film 51a, a polysilicon film 53a, and a tungsten film 54a, which are the same material as the gate structure 50 of the CMOS transistor CT, are stacked and disposed. The interlayer insulating film 58 made of a silicon oxide film or the like is disposed on the dicing region Rd.

Figure 12:
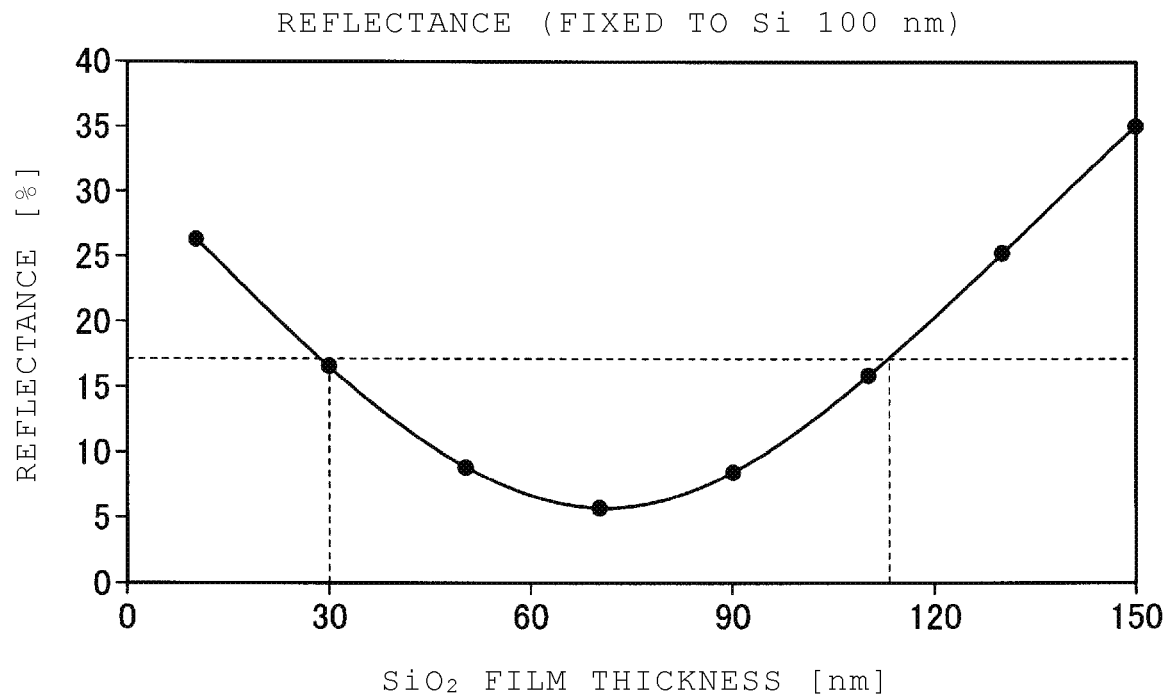
FIG. 12 is a graph showing a change in reflectance when a laser beam is incident from a second surface side of the wafer when a film thickness of a silicon oxide film is changed by fixing a film thickness of a polysilicon film in a multilayer film in which the silicon oxide film and the polysilicon film are stacked.
Figure 13:
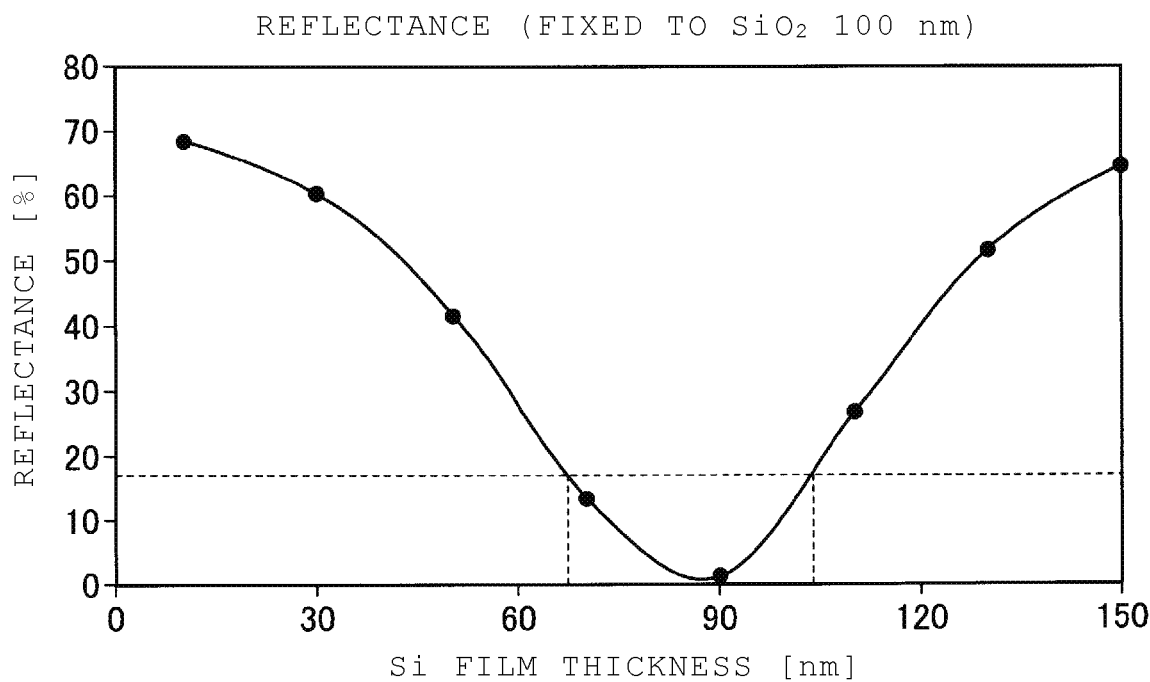
FIG. 13 is a graph showing a change in reflectance when a laser beam is incident from the second surface side of the wafer when the film thickness of the polysilicon film is changed by fixing the film thickness of the silicon oxide film in the multilayer film in which the silicon oxide film and the polysilicon film are stacked.

FIG. 12 is a graph showing a change in reflectance when a laser beam is incident from a second surface side of the wafer when a film thickness of a silicon oxide film is changed by fixing a film thickness of a polysilicon film in a multilayer film in which the silicon oxide film and the polysilicon film are stacked. FIG. 13 is a graph showing a change in reflectance when a laser beam is incident from the second surface side of the wafer when the film thickness of the polysilicon film is changed by fixing the film thickness of the silicon oxide film in the multilayer film in which the silicon oxide film and the polysilicon film are stacked. The horizontal axis indicates the film thickness of the silicon oxide film 51a in FIG. 12, and indicates the film thickness of the polysilicon film 53a in FIG. 13. In FIGS. 12 and 13, the vertical axis indicates reflectance.

As shown in FIG. 12, when the polysilicon film 53a is fixed to a film thickness of 100 nm, the film thickness of the silicon oxide film 51a is about 70 nm, and the reflectance is about 5%, which is the lowest. When the film thickness is thinner than about 70 nm or thicker than about 70 nm, the reflectance increases.

As shown in FIG. 4, in the mirror-polished wafer 41, the reflectance is 17%, and the modified layer 31 is normally formed by stealth dicing. Therefore, according to FIG. 12, the film thickness of the silicon oxide film 51a with a reflectance less than or equal to 17% when the polysilicon film 53a is 100 nm is about 30 nm to about 115 nm. That is, if the polysilicon film 53a is 100 nm and the silicon oxide film 51a is about 30 to 115 nm, the reflection of the laser beam L during stealth dicing can be reduced.

As shown in FIG. 13, when the silicon oxide film 51a is fixed to a film thickness of 100 nm, the film thickness of the polysilicon film 53a is about 90 nm, the reflectance is about 0%, which is the lowest. When the film thickness is thinner than about 90 nm, the reflectance increases, and when the film thickness is thicker than about 90 nm, the reflectance increases.

According to FIG. 13, the film thickness of the polysilicon film 53a with a reflectance less than or equal to 17% when the silicon oxide film 51a is 100 nm is about 65 nm to about 100 nm. That is, if the silicon oxide film 51a is 100 nm and the polysilicon film 53a is about 65 to 105 nm, the reflection of the laser beam L during stealth dicing can be reduced.

Thus, even when the silicon oxide film 51a and the polysilicon film 53a are stacked in the multilayer film, it is possible to reduce the reflection of the laser beam L during stealth dicing by appropriately controlling each film thickness.

Figure 14A:
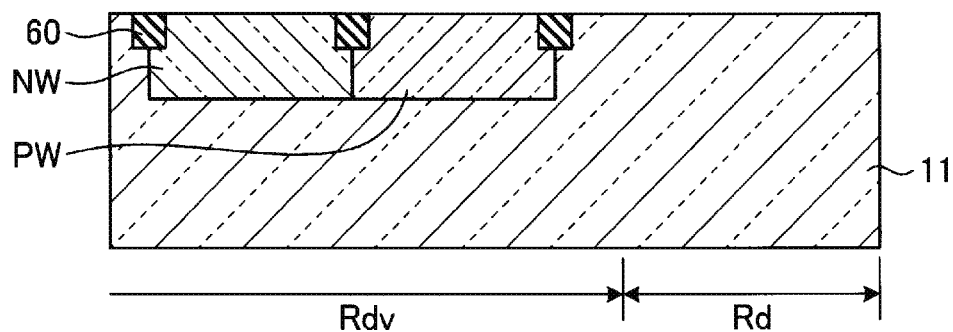
FIGS. 14A to 14L are cross-sectional views of the semiconductor device according to the third embodiment to explain an example of a procedure of a method of manufacturing the semiconductor device according to the third embodiment.

Below, a method of manufacturing a semiconductor device having such a structure is described. FIGS. 14A to 14L are cross-sectional views of the semiconductor device according to the third embodiment to explain an example of the procedure of the method of manufacturing the semiconductor device according to the third embodiment. First, as shown in FIG. 14A, an element isolation insulating film is formed on the first surface 11a of the device wafer 11 which is a semiconductor substrate by a method such as a shallow trench isolation (STI) method. Well implantation is performed in a predetermined region partitioned by the element isolation insulating film 60 to form a P-well 12P and an N-well 12N.

Figure 14B:
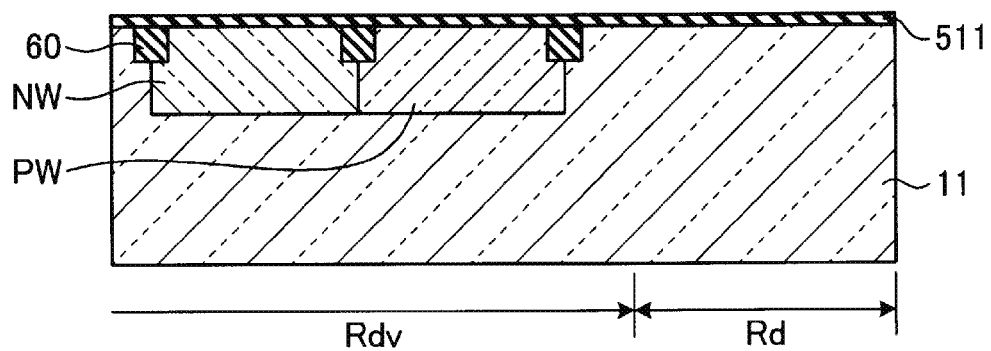
Figure 14C:
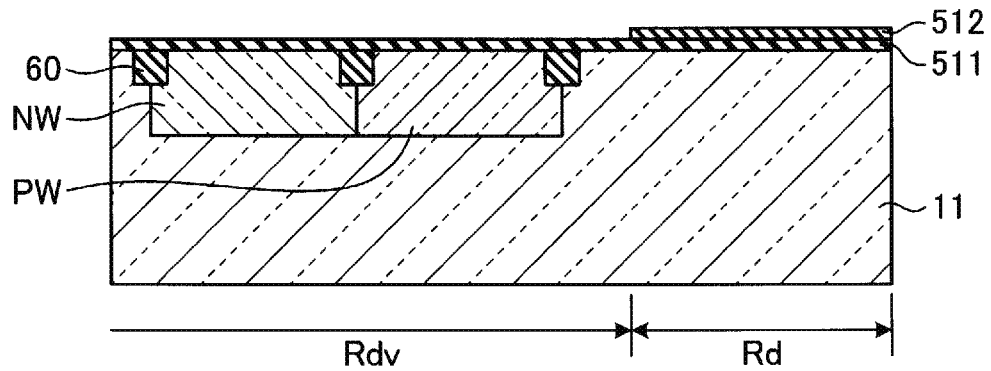

Next, as shown in FIG. 14B, a silicon oxide film 511 to be the gate insulating film 51 is formed on the entire first surface 11a of the device wafer 11 on which the element isolation insulating film is formed. Thereafter, as shown in FIG. 14C, the device disposition region Rdv is masked with a resist pattern or the like, and a silicon oxide film 512 is formed on the dicing region Rd. Here, the silicon oxide film 512 is formed such that the total film thickness of the silicon oxide films 511 and 512 formed in FIGS. 14B and 14C becomes a predetermined value.

Figure 14D:
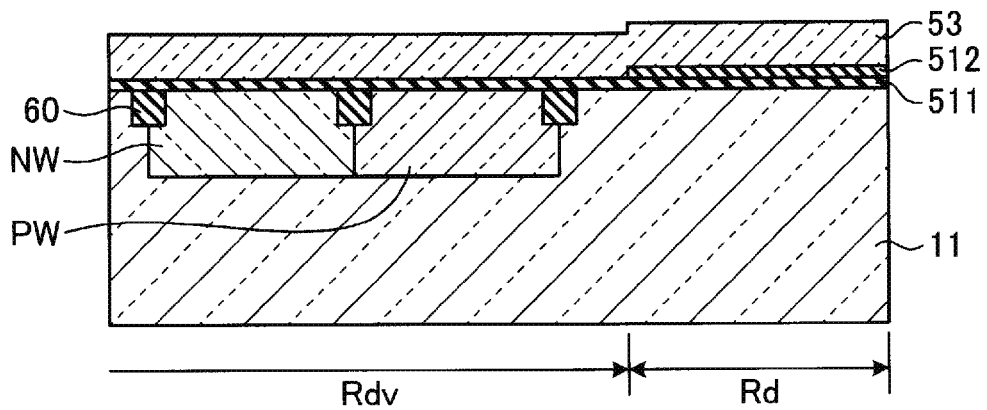
Figure 14E:
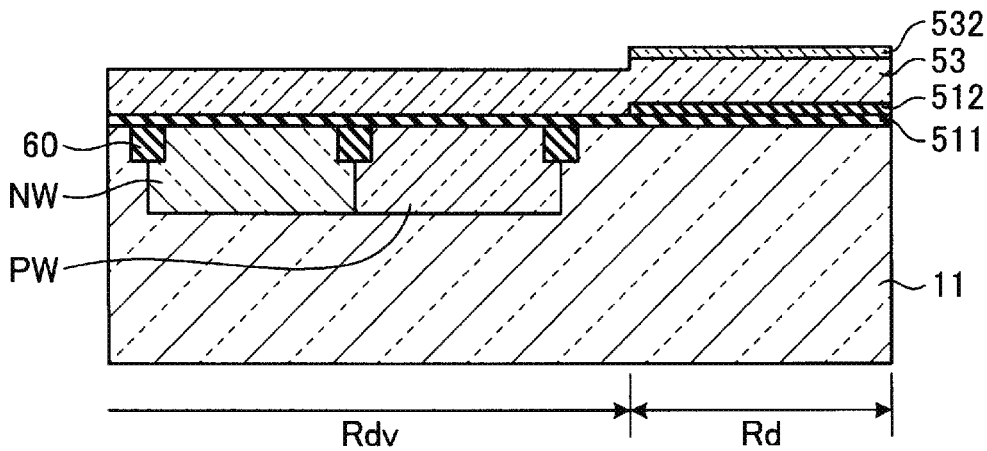

Next, as shown in FIG. 14D, the polysilicon film 53 to be a part of the gate electrode 52 is formed on the silicon oxide films 511 and 512. Thereafter, as shown in FIG. 14E, the device disposition region Rdv is masked by a resist pattern or the like, and a polysilicon film 532 is formed on the dicing region Rd. Here, the polysilicon film 532 is formed such that the total film thickness of the polysilicon films 53 and 532 formed in FIGS. 14D and 14E becomes a predetermined value.

Figure 14F:
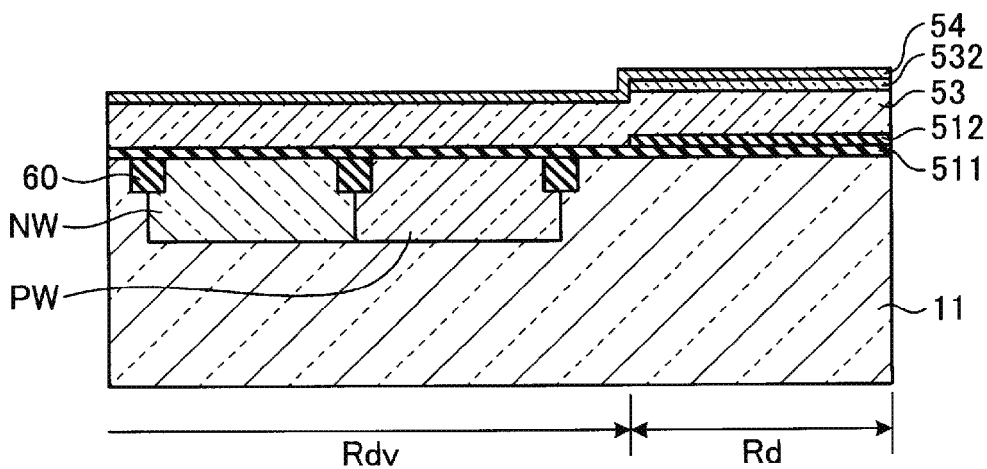
Figure 14G:
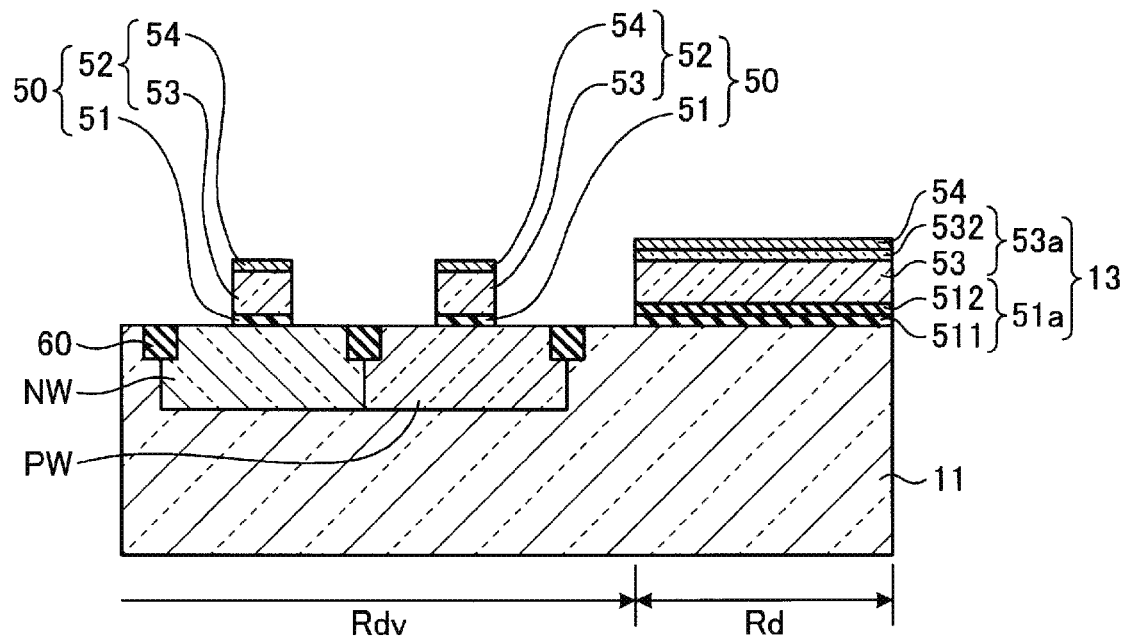

Next, as shown in FIG. 14F, a tungsten film 54 to be a part of the gate electrode 52 is formed on the polysilicon films 53 and 532. Then, as shown in FIG. 14G, the tungsten film 54, the polysilicon film 53, and the silicon oxide film 511 are processed by using a lithography technology and an etching technology, and the gate structure 50 having a predetermined shape is formed at predetermined positions on the N-well NW and the P-well PW of the device disposition region Rdv. That is, the silicon oxide film 511 becomes the gate insulating film 51, and the polysilicon film 53 and the tungsten film 54 become the gate electrode 52. Then, on the N-well NW and the P-well PW, the gate structure 50 in which the gate insulating film 51 and the gate electrode 52 are stacked is formed. In the dicing area Rd, the reflectance reducing layer 13 formed of a multilayer film in which silicon oxide films 511 and 512 and polysilicon films 53 and 532 are stacked is formed between the device wafer 11 and the tungsten film 54. Hereinafter, the silicon oxide films 511 and 512 are collectively referred to as the silicon oxide film 51a, and the polysilicon films 53 and 532 are collectively referred to as the polysilicon film 53a.

Figure 14H:
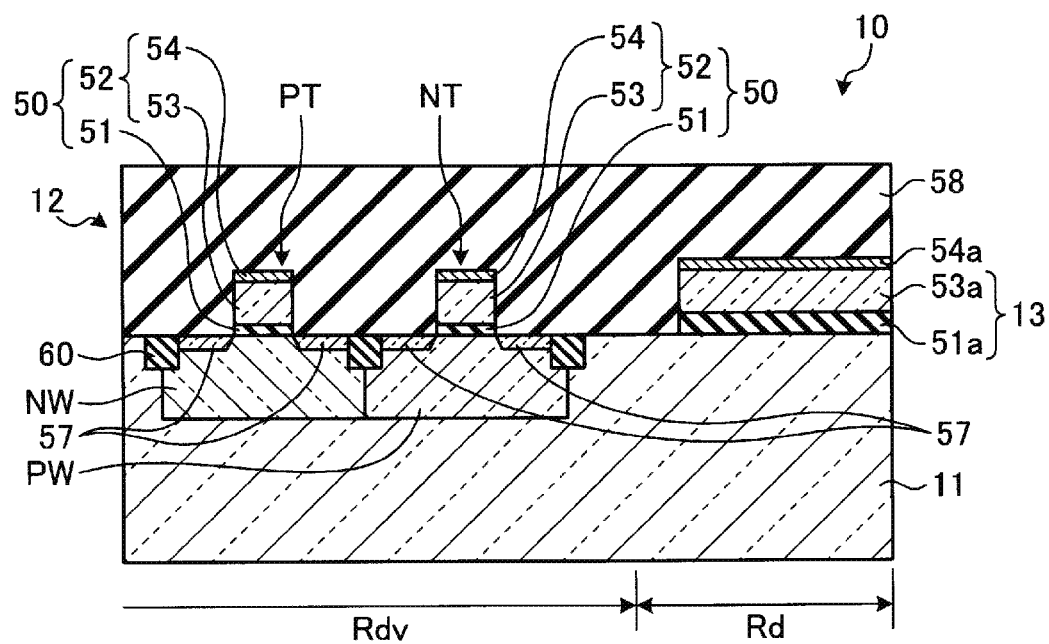

Then, as shown in FIG. 14H, ion implantation is performed by using the gate structure 50 as a mask, the source/drain regions 57 formed of a highly concentrated diffusion layer made of a P-type impurity is formed in the N-well NW, and the source/drain region 57 formed of a highly concentrated diffusion layer made of an N-type impurity is formed in the P-well PW. Thereby, the NMOS transistor NT is formed in the N-well NW, and the PMOS transistor PT is formed in the P-well PW. Thereafter, on the device wafer 11, device elements, a wiring layer, the interlayer insulating film 58 and the like are formed, and the device layer 12 is formed.

Figure 14I:
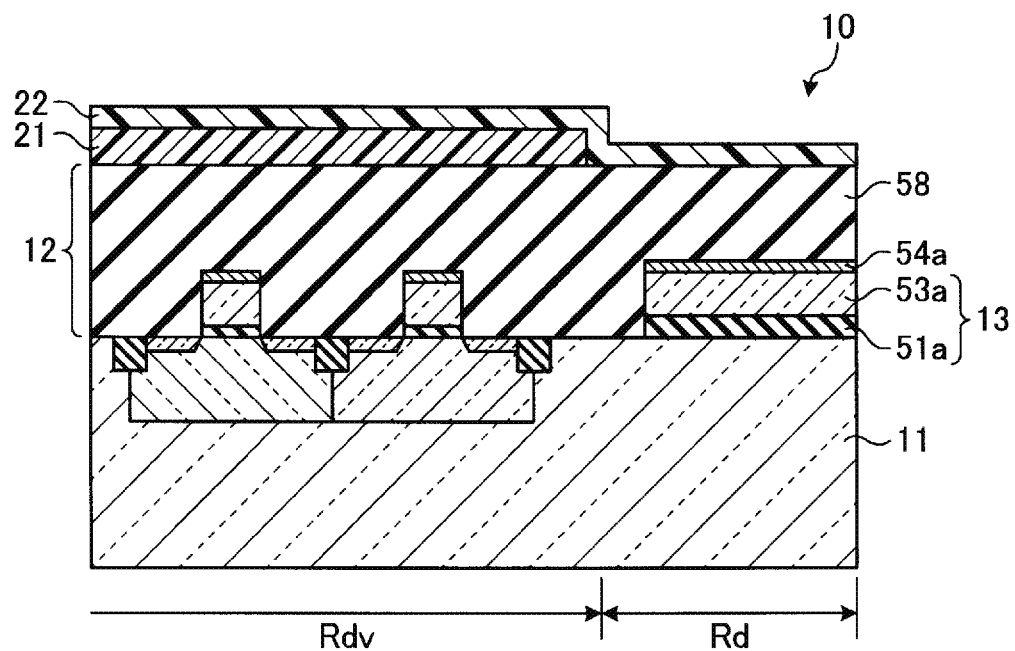

After the device layer 12 is formed, as shown in FIG. 14I, the passivation film 21 is formed on the first surface 11a side of the device wafer 11 on which the device layer 12 is formed. The passivation film 21 is, for example, a polyimide film. The tape 22 is attached on the passivation film 21.

Figure 14J:
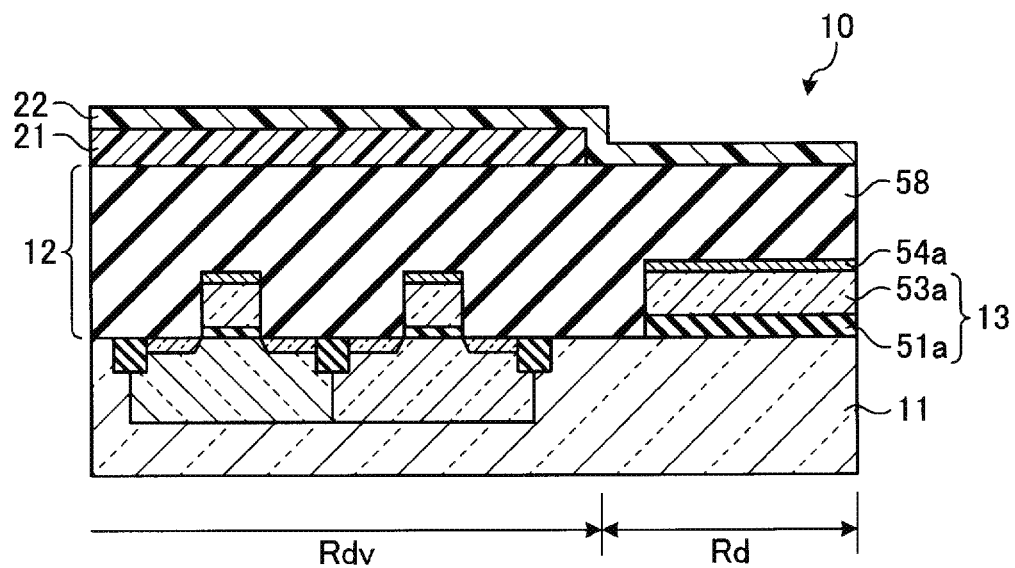

Next, as shown in FIG. 14J, the device wafer 11 is ground from the second surface side to a predetermined thickness. For example, back grinding is performed to a thickness less than or equal to 30 μm.

Figure 14K:
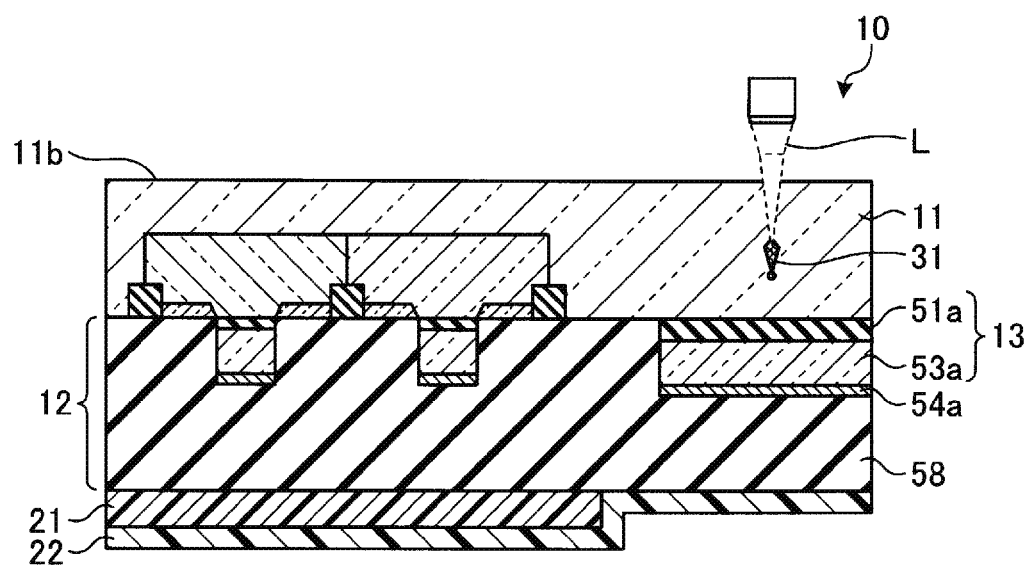

Then, as shown in FIG. 14K, the modification layers 31 are formed at predetermined intervals along the dicing region Rd of the device wafer 11 by stealth dicing. Here, since the reflectance reducing layer 13 is formed in the dicing region Rd, the reflection of the laser beam L on the tungsten film 54a is reduced, and the laser beam L reflected by the tungsten film 54a does not inhibit the formation of the modification layer 31. As a result, the modification layer 31 can be formed to the desired depth from the second surface 11b of the device wafer 11.

Figure 14L:
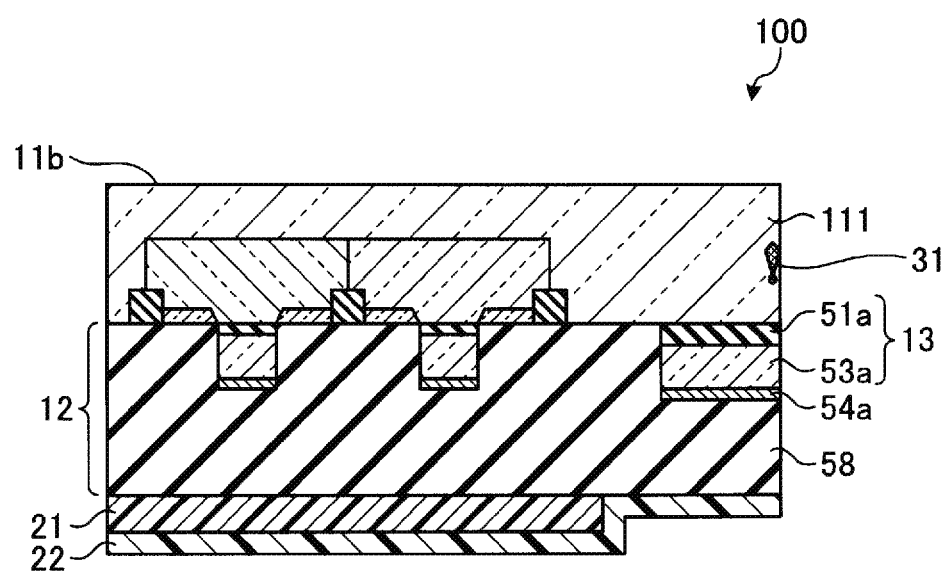

Then, as shown in FIG. 14L, after the modification layer 31 is formed, the tape is pulled toward the outer periphery. Thereby, the device wafer is diced into the chips 100. Thus, a semiconductor device is manufactured.

Here, the multilayer film capable of reducing the reflectance of the laser beam L when the wavelength of the laser beam L used in stealth dicing is 1,342 nm was described. However, if the wavelength of the laser beam L used in stealth dicing changes, the configuration of the multilayer film of the reflectance reducing layer 13 changes accordingly. That is, the type of multilayer film and the film thickness of each film constituting the multilayer film may be changed according to the wavelength of the laser beam L to be used.

In the third embodiment, a multilayer film which reduces reflection by using thin film optics as the reflectance reducing layer 13 is provided between the device wafer 11 and the metal film. Thereby, the inhibition of the generation of the modification layer 31 due to the reflection of the laser beam L during stealth dicing is reduced. As a result, the modification layer 31 can be formed at the desired position even with the thin device wafer 11, and the device wafer 11 can be diced.

When the CMOS transistor CT is disposed in the device disposition region Rdv of the device wafer 11, a multilayer film formed of the gate insulating film 51 to be used in the CMOS transistor CT and the polysilicon film 53 constituting the gate electrode 52 can be used as the reflectance reducing layer 13. As a result, compared with the case of introducing a step of forming a multilayer film which is completely different from the step of forming the device layer 12 to be disposed in the device disposition region Rdv in the dicing region Rd, the time and effort of forming the reflectance reducing layer 13 can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a semiconductor wafer chip including a device region and a peripheral region around the device region, the peripheral region including a plurality of voids aligned along a side surface of the semiconductor wafer chip at a predetermined depth from a first surface of the semiconductor wafer chip;
   a semiconductor device layer on the first surface of the semiconductor wafer chip in the device region, the semiconductor device layer including a portion of a transistor; and
   a multi-layer anti-reflection layer on the first surface of the semiconductor wafer chip in the peripheral region that reduces a reflection of laser light incident from a second surface of the semiconductor wafer chip opposite to the first surface, wherein the multi-layer anti-reflection layer includes an insulating layer provided on the first surface of the semiconductor wafer chip and a semiconductor layer provided on the insulating layer, the semiconductor layer being a same material, and having a same thickness, as a gate electrode layer of the transistor.

2. The semiconductor device according to claim 1, wherein a reflectance of the laser light incident from the second surface of the semiconductor wafer chip is equal to or less than 17%.

3. The semiconductor device according to claim 1, wherein a maximum roughness depth of a surface of the multi-layer anti-reflection layer opposite to a surface of the multi-layer anti-reflection layer facing the semiconductor wafer chip is less than 1.4 µm.

4. The semiconductor device according to claim 1, wherein the insulating layer of the multi-layer anti-reflection layer is formed of a same material as a gate insulating layer of the semiconductor device layer.

5. The semiconductor device according to claim 1, wherein a thickness of the semiconductor wafer chip is less than 30 µm.

6. The semiconductor device according to claim 1, further comprising:
   a metal layer on a surface of the multi-layer anti-reflection layer opposite to a surface of the multi-layer anti-reflection layer facing the semiconductor wafer chip.

7. The semiconductor device according to claim 1, wherein the predetermined depth is less than 6 µm.

8. The semiconductor device according to claim 1, wherein the insulating layer has a same thickness as a gate insulating layer of the transistor.

9. A semiconductor device, comprising:
   a semiconductor wafer chip including a device region and a peripheral region around the device region, the peripheral region including a plurality of voids aligned along a side surface of the semiconductor wafer chip at a predetermined depth from a first surface of the semiconductor wafer chip;
   a semiconductor device layer on the first surface of the semiconductor wafer chip in the device region, the semiconductor device layer including a portion of a transistor; and
   a multi-layer anti-reflection layer on the first surface of the semiconductor wafer chip in the peripheral region that reduces a reflection of laser light incident from a second surface of the semiconductor wafer chip opposite to the first surface, wherein the multi-layer anti-reflection layer includes an insulating layer provided on the first surface of the semiconductor wafer chip and a semiconductor layer provided on the insulating layer, the insulating layer having a same thickness as a gate insulating layer between a gate electrode layer of the transistor and the first surface of the semiconductor wafer chip.

10. The semiconductor device according to claim 9, wherein a reflectance of the laser light incident from the second surface of the semiconductor wafer chip is equal to or less than 17%.

11. The semiconductor device according to claim 9, wherein a maximum roughness depth of a surface of the multi-layer anti-reflection layer opposite to a surface of the multi-layer anti-reflection layer facing the semiconductor wafer chip is less than 1.4 µm.

12. The semiconductor device according to claim 9, wherein at least one layer of the multi-layer anti-reflection layer is formed of a same material as in the semiconductor device layer.

13. The semiconductor device according to claim 9, wherein a thickness of the semiconductor wafer chip is less than 30 µm.

14. The semiconductor device according to claim 9, further comprising:
   a metal layer on a surface of the multi-layer anti-reflection layer opposite to a surface of the multi-layer anti-reflection layer facing the semiconductor wafer chip.

15. The semiconductor device according to claim 9, wherein the predetermined depth is less than 6 µm.

* * * * *